United States Patent [19]

Arakawa

[11] Patent Number: 5,198,997
[45] Date of Patent: Mar. 30, 1993

[54] ULTRAVIOLET ERASABLE NONVOLATILE MEMORY WITH CURRENT MIRROR CIRCUIT TYPE SENSE AMPLIFIER

[75] Inventor: Hideki Arakawa, Kanagawa, Japan

[73] Assignee: Sony Corporation, Tokyo, Japan

[21] Appl. No.: 818,113

[22] Filed: Jan. 8, 1992

Related U.S. Application Data

[62] Division of Ser. No. 565,136, Aug. 10, 1990, abandoned.

[30] Foreign Application Priority Data

Aug. 11, 1989 [JP] Japan .................................. 1-208703

[51] Int. Cl.⁵ .............................................. G11C 11/40
[52] U.S. Cl. .................................... 365/185; 365/190; 365/207; 365/208; 365/210
[58] Field of Search ................ 365/185, 207, 208, 210, 365/190

[56] References Cited

U.S. PATENT DOCUMENTS

| | | | |
|---|---|---|---|
| 4,611,301 | 9/1986 | Iwahashi et al. | 305/207 |
| 4,713,797 | 12/1987 | Morton et al. | 365/208 |
| 4,799,195 | 1/1989 | Iwahashi et al. | 365/210 |
| 4,819,212 | 4/1989 | Nakai et al. | 365/210 |
| 4,843,594 | 6/1989 | Tanaka et al. | 365/208 |
| 4,916,665 | 4/1990 | Atsumi et al. | 365/208 |
| 5,022,003 | 6/1991 | Kohno | 305/208 |

Primary Examiner—Joseph E. Clawson, Jr.
Attorney, Agent, or Firm—Hill, Steadman & Simpson

[57] ABSTRACT

An ultraviolet erasable nonvolatile memory device comprising a plurality of memory cells which are erasable by ultraviolet rays employs a sense amplifier consisting a current mirror circuit. The current mirror circuit is connected to the memory cells and a reference cell respectively for readout. In one example, an effective control gate voltage of the reference cell is set to a lower value than that of the memory cells. The current drivability of the reference cell exhibits an intermediate value between that of erased memory cell and that of programmed memory cell. In another example, a constant current source is provided at a node between the memory cells and the current mirror circuit, so that a current on the reference cell side is subtracted by the constant current source.

3 Claims, 6 Drawing Sheets

ULTRAVIOLET ERASABLE NONVOLATILE MEMORY WITH CURRENT MIRROR CIRCUIT TYPE SENSE AMPLIFIER

This is a division of application Ser. No. 565,136, filed Aug. 10, 1990 now abandoned.

BACKGROUND OF THE INVENTION

1. Field of the Invention

This invention relates to an ultraviolet erasable nonvolatile memory device, and more particularly to an ultraviolet erasable nonvolatile memory device using a current mirror circuit as a sense amplifier.

2. Description of the Prior Art

Nonvolatile memory devices can erase, by irradiation of ultraviolet rays or electrically, information stored in memory cells.

Meanwhile, in order to read out information stored in those memory cells, sense amplifiers are generally used. As these sense amplifiers, sense amplifiers of various structures are known. For example, there are a sense amplifier to sense a potential on a bit line to amplify the potential by an invertor to read out it, a sense amplifier to input a potential on a bit line of the reference cell and a potential on a bit line of the memory cell to a differential amplifier to provide an output by comparison between the both voltages, and the like. In addition, a sense amplifier using a current mirror circuit is also known. As the technology relating to such a sense amplifier using a current mirror circuit, there is known a technology described in '1989, IEEE, ISSCC (International Solid-State Circuits Conference), Digest of Technical Papers, on pages 138 and 139, "NONVOLATILE MEMORIES/ A 1 Mb FLASH EEPROM'".

FIG. 1 shows such a sense amplifier using a current mirror circuit. This current mirror circuit is comprised of a pair of pMOS transistors 71 and 72. A power supply voltage Vcc is delivered to each source. The drain 78 of the pMOS transistor 71 is commonly connected to respective gates of the pMOS transistors 71 and 72. The drain of the pMOS transistor 72 serves as a sensing node 73. A potential on the node 73 is amplified by inverters 74 and 74, etc. and is outputted therefrom. A memory cell 77 in which information are stored is connected to the sensing node 73 through an nMOS transistor 75 having a low threshold voltage Vth functioning as a limiter by an invertor 81 and a column select transistor 76. Further, the drain 78 of the transistor 71 is connected to a reference cell 80 through an nMOS transistor 79 having a low threshold voltage Vth functioning as a limiter by an invertor 82 in a manner similar to the above. The memory cell 77 and the reference cell 80 are of structures comprising a floating gate and a control gate stacked through insulating films, respectively. The power supply voltage Vcc is delivered to the control gate of the reference cell. The control gate of the memory cell 77 serves as a word line.

In the sense amplifier of such a structure, a potential on the sensing node 73 rises and falls in dependency upon a difference between the current drivability of the reference cell 80 and the current drivability of the memory cell 77. A potential difference thus obtained is amplified and is read out.

However, such a sense amplifier comprised of a current mirror circuit effectively becomes operative because the memory cell 77 is of an electrically erasable type, that sense amplifier cannot be applied to a nonvolatile memory device for erasing information in memory cells by ultraviolet rays.

Namely, in the nonvolatile memory device of the structure of FIG. 1, the reference cell 80 is erased by ultraviolet rays, but the memory cell 77 is electrically erased. As a result, there is a tendency that the floating gate is charged plus by an electrical erase operation (overerase operation) of the memory cell 77. Thus, as shown in FIG. 2, the current characteristic of a ultraviolet-ray erased cell of the reference cell becomes equal to an intermediate characteristic between the current characteristic of a programmed cell and the current characteristic of an over-erased memory cell. As a result, there occurs a difference between a potential when the memory cell 77 is erased and a potential when it undergoes a write operation, and such a potential difference is read out. In FIG. 2, the ordinate and the abscissa represent a current and a control gate voltage, respectively.

However, in a nonvolatile memory device which is not of a type of electrically erasing memory cells, but a type of erasing them by ultraviolet rays, the current characteristic of an erased memory cell becomes in correspondence with the current characteristic based on erasing by ultraviolet rays of the reference cell. For this reason, the sense amplifier might erroneously judge the memory cell to be in a written state although it is erased in an extreme case because of unevenness in production, and the like.

As a measure for such an erroneous operation, there is conceivable a method of holding down the channel width of the pMOS transistor 72 constituting the current mirror circuit of FIG. 1 to one half of that of the transistor 71. However, this method presents a current characteristic different from the current characteristic of the cell. As a result, the sensitivity in a readout operation would vary to much extent in dependency upon a write level.

SUMMARY OF THE INVENTION

It is the principal object of this invention to provide an improved ultraviolet erasable nonvolatile memory device in which a sense amplifier is able to sense without error using ultraviolet erasable memory cells and a ultraviolet erasable reference cell.

According to one embodiment of the invention, an ultraviolet erasable nonvolatile memory device includes a sense amplifier in which a reference cell and memory cells are respectively connected to a current mirror circuit to amplify a potential on a node on the memory cell side to read out the data.

The control gate of the reference cell is supplied with a lower effective voltage than a predetermined voltage which is supplied to the memory cells. In this embodiment, an intermediate current drivability between the current drivability in a state erased by ultraviolet rays and the current drivability in a programmed state is obtained in the reference cell.

According to another embodiment of the invention, a sense amplifier using a current mirror circuit to which a reference cell and a memory cell are respectively connected amplify a potential on a node of the memory cell side. A constant current source is connected to the node, so a current on the memory cell side which originally reflects a current on the reference cell side by the current mirror circuit is subtracted by a fixed quantity of currents.

DETAILED DESCRIPTION OF THE PREFERRED EMBODIMENTS

First embodiment

This embodiment is directed to an example of an EPROM having a sense amplifier in which the control gate voltage of the reference cell is lowered.

Figure 3:
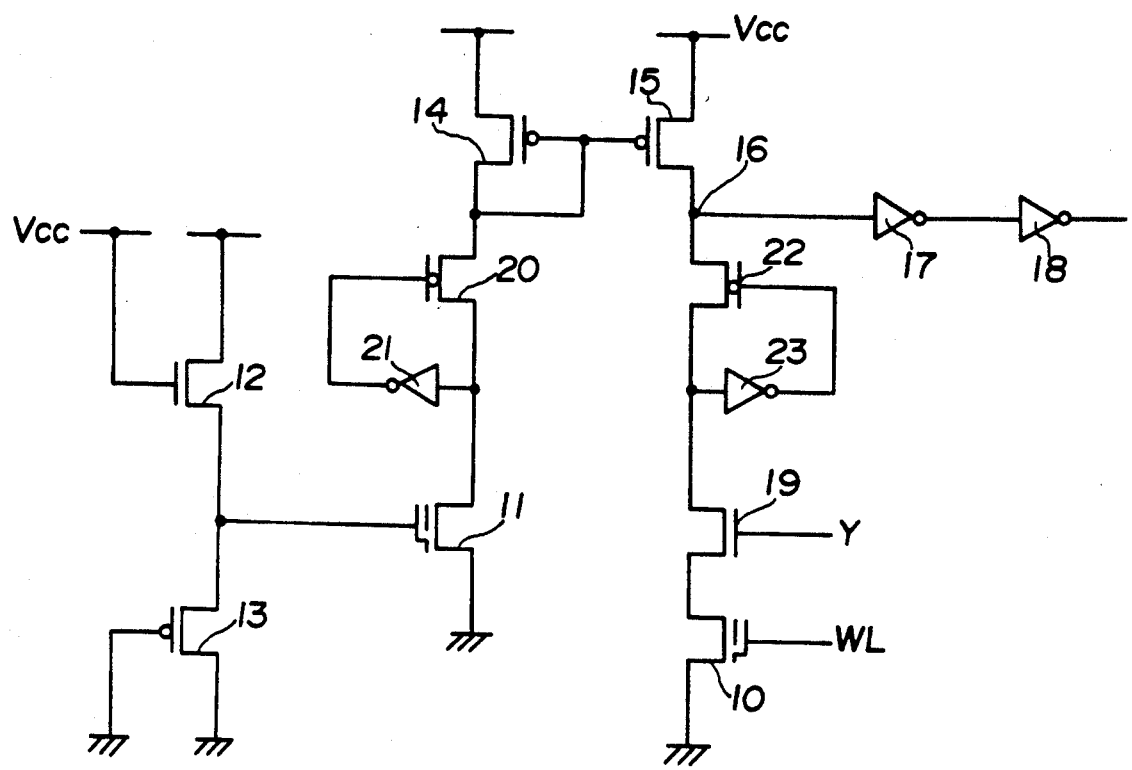
FIG. 3 is a circuit diagram showing the circuit configuration of an embodiment of a ultraviolet-ray erasable nonvolatile memory device according to this invention.

Its circuit configuration comprises, as shown in FIG. 3, a current mirror circuit comprised of a pair of pMOS transistors 14 and 15. A power supply voltage Vcc is delivered to each of sources of the pair of pMOS transistors 14 and 15. Respective gates of the pair of pMOS transistors 14 and 15 are commonly connected and the junction thereof is connected to the drain of the pMOS transistor 14.

The drain of the pMOS transistor 15 serves as a sensing node 16. By amplifying a potential on the sensing node 16, readout operation is carried out. Inverters 17 and 18 connected in series are connected to the sensing node 16. Amplification of a voltage is carried out by these inverters 17 and 18.

One of the source and the drain of an nMOS transistor 22 having a low threshold voltage functioning as a limiter is connected to the sensing node 16. The other of the source and the drain of the nMOS transistor 22 is connected to a bit line. A voltage on the bit line is inverted by the invertor 23 and the inverted voltage is delivered to the gate of the nMOS transistor 22.

Further, one of the source and the drain of memory cell 10 is connected to the bit line through a column select transistor 19 selected by a column select line Y. A ground voltage GND is delivered to the other of the source and the drain. Although not shown, a plurality of memory cells 10 are arranged in a matrix manner, and column select transistors 19 are also arranged in correspondence with the number of columns. Each memory cell 10 is of a structure comprising a floating gate and a control gate stacked through insulating films, respectively. The control gate is connected to the word line WL for selection of the row. The word line WL is supplied with predetermined voltages at the selecting time by a row decoder. The memory cell 10 is such that information can be written thereinto by injecting electrons into the floating gate, and erased therefrom by ultraviolet rays.

The drain of the pMOS transistor 14 is connected to one of the source and the drain of an nMOS transistor 20 having a low threshold voltage. The other of the source and the drain of the nMOS transistor 20 is connected to the reference cell 11. The output terminal of an invertor 21 is connected to the gate of the nMOS transistor 20, and the input terminal of the invertor 21 is connected to the other of the source and the drain of the nMOS transistor 20. These nMOS transistor 20 and invertor 21 operate in a manner similar to the nMOS transistor 22 and the invertor 23 mentioned above, respectively.

The reference cell 11 is an element having a current drivability transmitted to the sensing node 16 by the current mirror circuit, and include a floating gate and a control gate stacked through insulating films, respectively. This reference cell 11 is formed in accordance with the same process as that of the memory cell 10. Accordingly, even in the case where there occurs unevenness in the process, the reference cell 11 and the memory cell 10 have the same tendency. The ground voltage GND is delivered to the source/drain on the side opposite to the side connected to the nMOS transistor of the reference cell 11. A voltage which is lower than the power supply voltage Vcc by the threshold voltage Vth through the nMOS transistor 12 is delivered to the control gate of the reference cell 11. Namely, the nMOS transistor 12 and the pMOS transistor 13 are connected in series between the power supply voltage Vcc and the ground voltage GND. The drain/gate of the nMOS transistor 12 are placed at the power supply voltage Vcc, and the drain/gate of the pMOS transistor 13 are placed at the ground voltage GND. These nMOS transistor 12 and pMOS transistor 13 are in a diode connection state, respectively, and a potential on the source is set to Vcc-Vth. This voltage is delivered to the control gate of the reference cell 11. Assuming now that the power supply voltage Vcc is equal to about 5 volts, because the threshold voltage Vth is about 1 volt, a voltage delivered to the gate of the reference cell 11 becomes equal to about 4 volts.

The EPROM having such a circuit configuration operates as follows.

Because the reference cell 11 has undergone erase operation by ultraviolet rays, the current drivability of the reference cell 11 becomes large. However, a voltage delivered to the control gate of the reference cell 11 is lowered by the threshold voltage Vth by the nMOS transistor 12, etc. As a result, the current drivability of the reference cell 11 is reduced accordingly. A current flowing in the reference cell 11 flows into the pMOS transistor 14 constituting the current mirror circuit. Thus, a current flowing in the pMOS transistor 15 depends upon the current drivability of the reference cell 11. As stated above, a current flowing in the pMOS transistor 15 flows into the sensing node 16 while depending upon the current drivability of the reference cell 11 reduced by the threshold voltage Vth thereof. The memory cell 10 is connected to the sensing node 16 through the column select transistor 19, etc. In the case where the memory cell 10 is in a written state, because the current drivability of the memory cell 10 is low, a potential on the sensing node 16 is placed at a high value. On the other hand, in the case where the memory cell 10 is placed in an erased state by ultraviolet rays, the current drivability of the memory cell 10 becomes high, but because a current flowing in the pMOS transistor 15 reflecting the reference cell 11 is suppressed by a drop of the threshold voltage Vth, there occurs a difference corresponding to that voltage drop, with the result that a potential on the sensing node 16 is placed at a lower value. Accordingly, whether information is written into the memory cell 10 or is erased therefrom may be sensed.

Since the reference cell 11 is formed by the same process as that of the memory cell 10 is such an EPROM, even in the case where the characteristic of the memory cell 10 varies, the reference cell 11 also varies with the same tendency as that of the memory cell. Thus, sensing does not undergo the influence of unevenness in the process. Further, when a write level changes, generally the operating point changes. However, as described later with reference to FIG. 5, since the reference cell 11 has the same characteristic curve as that of the memory cell 10, a stable readout operation can be mode regardless of presence and absence of a write operation.

In addition, by providing the means for somewhat lowering the control voltage at the time of a verify operation, or for increasing a current caused to flow from the sensing node 16, it is possible to become an additional write pulse unnecessary.

Second embodiment

An EPROM of this embodiment is characterized in that a constant current source is provided at the sensing node.

Figure 4:
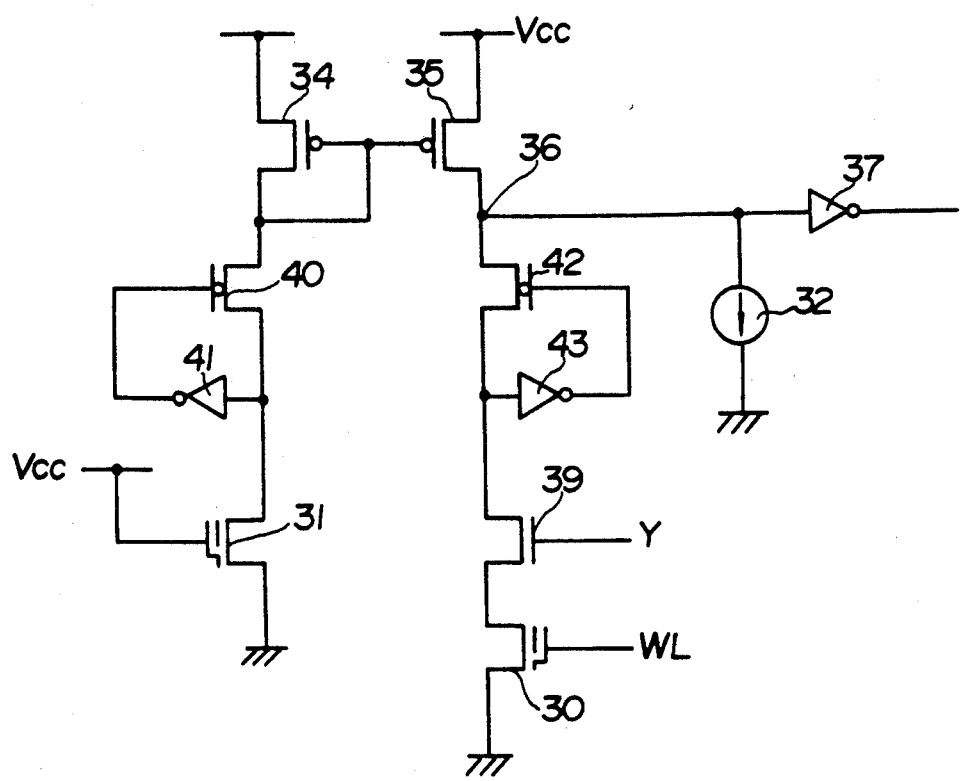
FIG. 4 is a circuit diagram showing the circuit configuration of another embodiment of a ultraviolet-ray erasable nonvolatile memory device according to this invention.

Its circuit configuration includes, as shown in FIG. 4, a current mirror circuit comprised of a pair of pMOS transistors 34 and 35. A power supply voltage Vcc is delivered to each source of the pair of pMOS transistors 34 and 35. The gates of the pair of pMOS transistors 34 and 35 are commonly connected to the drain of the pMOS transistor 34.

The drain of the pMOS transistor 35 serves as a sensing node 36. By amplifying a potential on the sensing node 36, a readout operation is carried out. An invertor 37 is connected to the sensing node 36. By this invertor 37, amplification of a voltage is carried out. In the EPROM of this embodiment, a constant current source 32 is further connected to the sensing node 36. A ground voltage GND is delivered to a node on the opposite side of the sensing node 36 of the constant current source 32. This constant current source 32 serves to allow a current flowing in the pMOS transistor 35 through a path difference from that of the memory cell 30, and seemingly functions to lower the current drivability of the reference cell 31.

One of the source and the drain of an nMOS transistor 42 having a low threshold voltage functioning as a limiter is connected to the sensing node 36 in the same manner as in the EPROM of the first embodiment. The other of the source and the drain of the nMOS transistor 42 is connected to a bit line. A voltage on the bit line is inverted by an invertor 43 and the inverted voltage is delivered to the gate of the nMOS transistor 42.

Further, one of the source and the drain of a memory cell 30 is connected to the bit line through a column select transistor 39 selected by a column select line Y. The ground voltage GND is delivered to the other of the source and the drain thereof. Although not shown, a plurality of memory cells 30 are arranged in a matrix manner, and column select transistors 39 are arranged in correspondence with the number of columns. Each memory cell 30 is of a structure comprising a floating gate and a control gate stacked through insulating films, respectively. The control gate is connected to a word line WL for selection of row. The memory cell 30 is such that information can be written by injecting electrons into the floating gate, and erased therefrom by ultraviolet rays.

The drain of the pMOS transistor 34 is connected to one of the source and the drain of an nMOS transistor 40 having a low threshold voltage, and the other of the source and the drain of the nMOS transistor 40 is connected to the reference cell 31. The output terminal of an invertor 41 is connected to the gate of the nMOS transistor 40, and the input terminal of the invertor 41 is connected to the other of the source and the drain of the nMOS transistor 40.

The reference cell 31 is an element having a current drivability transmitted to the sensing node 36 by the current mirror circuit, and includes a floating gate and a control gate stacked through insulating films, respectively. This reference cell 31 is formed by the same process as that of the memory cell 30. Accordingly, even in the case where there occurs unevenness in the process, the reference cell 31 and the memory cell 30 will have the same tendency. The ground voltage GND is delivered to the source and the drain on the side opposite to the side connected to the nMOS transistor of the reference cell 31. Further, the power supply voltage Vcc is delivered to the control gate of the reference cell 31.

The EPROM of this embodiment having such a circuit configuration has a high current drivability because the reference cell 31 is subjected to an erase operation by ultraviolet rays. However, since a current in the pMOS transistor 35 of the current mirror circuit is subtracted by the constant current source 32, the current drivability of the reference cell 31 seemingly becomes equal to an intermediate value between the current drivability at the time of a write operation of the memory cell and that at the time of an erase operation thereof.

Namely, a current flowing in the reference cell 31 becomes equal to a current flowing in the pMOS transistor 34 as it is. Further, the current drivability of the current mirror connected pMOS transistor 35 also becomes equal to a value reflecting the current drivability of the reference cell 31. However, since the constant current source 32 is connected to the sensing node 36 connected to the pMOS transistor 35, a current flowing on the memory cell 30 side becomes equal to a portion of a current which has been passed through the pMOS transistor 35. For this reason, the current drivability of the pMOS transistor 35 becomes equal to an intermediate value between the current drivability of the memory cell 30 at the time of a write operation thereof and that at an erase operation thereof. Accordingly, at the time of a write operation, a potential on the sensing node 36 rises, and at the time of an erase operation, a potential on the sensing node 36 falls. A reliable readout operation is thus carried out.

Since the reference cell 31 is formed by the same process as that of the memory cell 30 in such an EPROM, changes in the characteristics of respective cells 30 and 31 have the same tendency. As a result, sensing is not affected by the influence of unevenness in the process. Further, even when a write level varies, as described later with reference to FIG. 5, the reference cell 31 has the same characteristic curve as that of the memory cell 30. Thus, a stable readout operation can be made. In addition, also at the time of a verify operation, it is possible to become an additional write pulse unnecessary. Element characteristic of the first and the second embodiments (see FIG. 5)

The EPROM which has been described in the first and second embodiments will now be described in more detail with reference to FIG. 5 while making a comparison with an example of reference.

Figure 5:
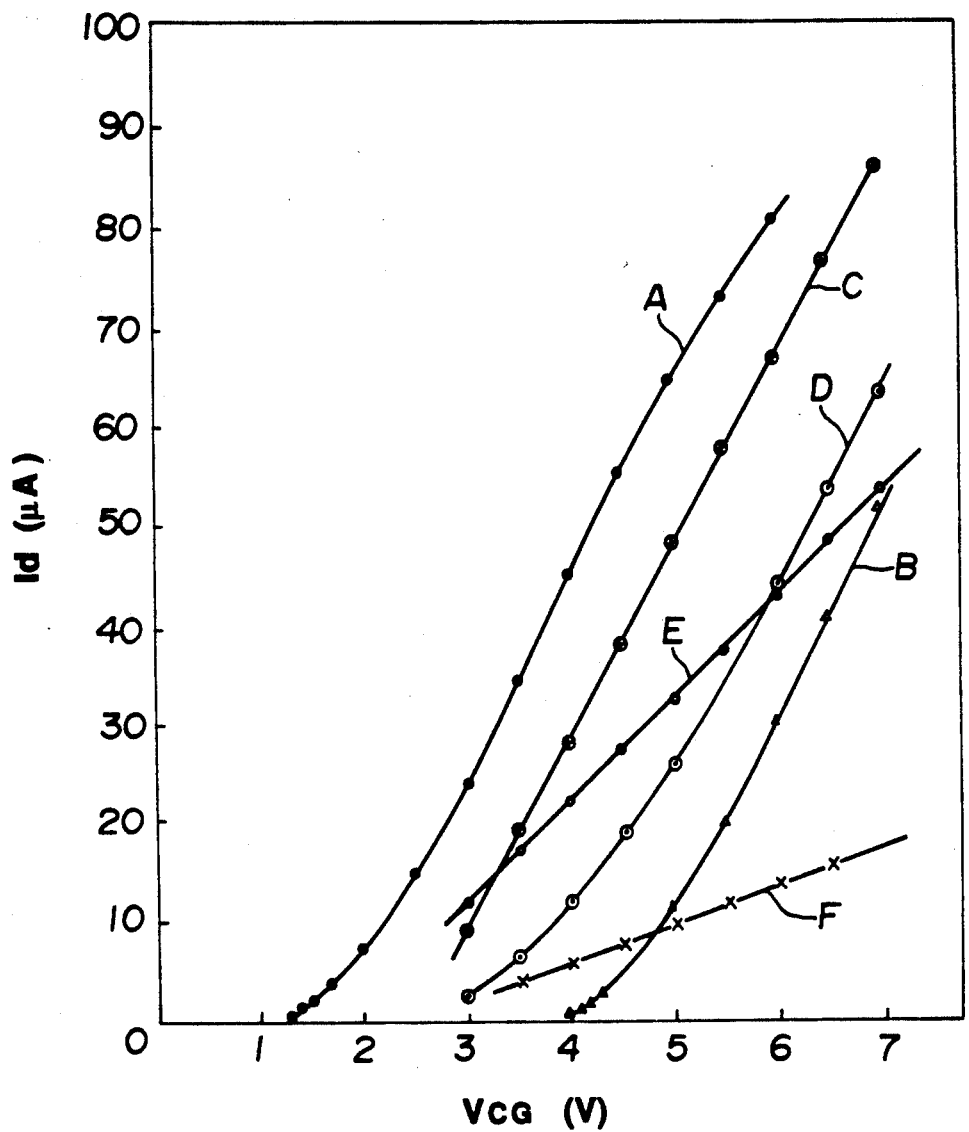
FIG. 5 is a characteristic diagram showing current characteristics of elements in the above mentioned respective embodiment and the reference example.

FIG. 5 is a diagram in which the abscissa and the ordinate are taken as a control gate voltage and a drain current, respectively. The curve A represents the current drivabilities of the memory cell and the reference cell in the case where erasing is conducted by ultraviolet rays. In the case where the reference cell and the memory cell are both of ultraviolet-ray erasable type, they exhibit the same curve as they are. As a result, it is difficult to use the reference cell for reference. On the other hand, the curve B is a curve in the case where writing is conducted into the memory cell. As compared to the erased case (curve A), a current value at the same control gate voltage becomes small. As stated above, the current drivability of the memory cell is represented as the curve B in the written case and is represented as the curve A in the erased case.

The curve F represents an element characteristic of the reference example No. 1. Although not shown, no reference cell is used and a load connected to the sensing node is fixed to a pMOS transistor (W/L=4/40). This curve F represents a substantially linear current characteristic which rises at a low rate. Judgment can be made because the curve F is located between curves A and B in the vicinity of 4 volts, but its current value is low, so an employment of the curve F is not practical.

Figure 1:
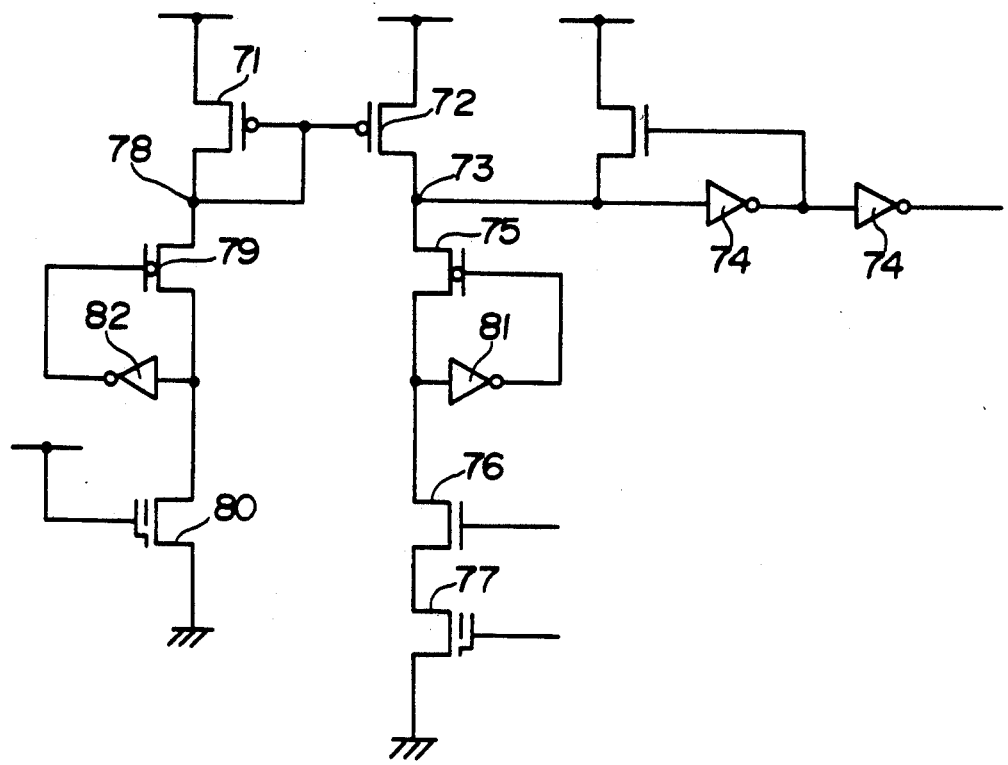
FIG. 1 is a circuit diagram of an of a conventional nonvolatile memory device.
Figure 2:
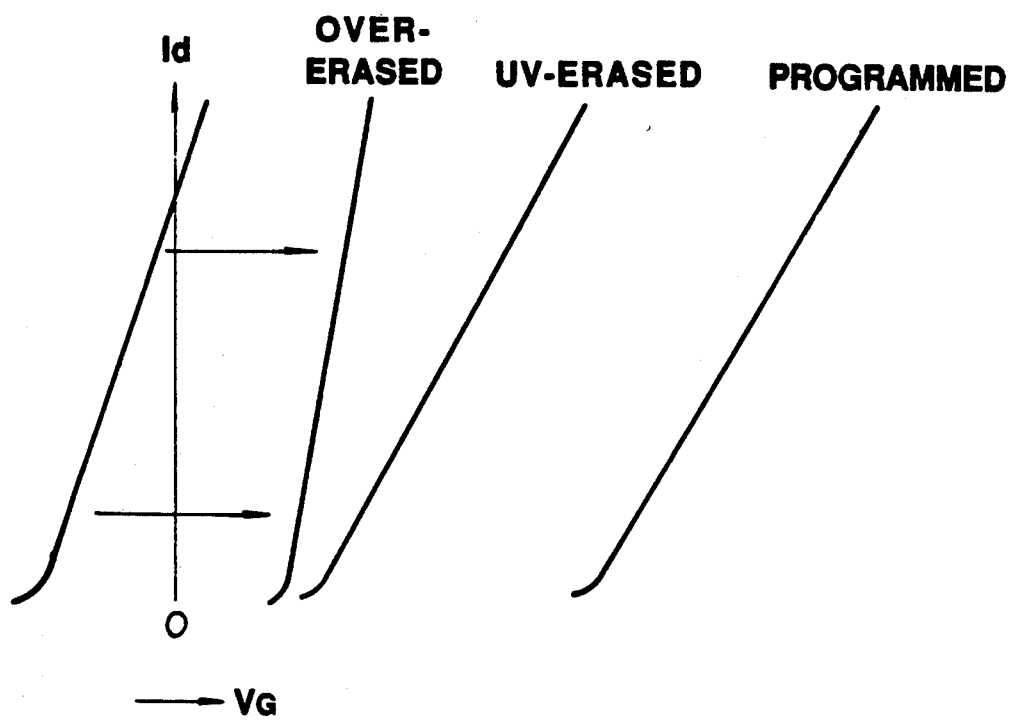
FIG. 2 is a characteristic diagram showing the relationship between a control gate voltage and a drain current for explaining the operation of the conventional example.

Further, the curve E represents an element characteristic of the reference example No. 2. In the circuit of FIG. 1, the channel width of the pMOS transistor 72 is set to a value one half of the channel width of the pMOS transistor 71. In the case of this curve E, the current drivability of the pMOS transistor 72 rises at a rate higher than that of the curve F and becomes close to the current drivabilities (curves A and B) of the memory cell, but the gradient of rise is not in parallel to those of the curves A and B. Accordingly, in dependency upon changes in the control gate voltage or the write level, the operating point of sensing would vary. As a result, a stable readout operation cannot be carried out.

The curve C represents a characteristic curve of the second embodiment. A current flowing in the pMOS transistor 34 seemingly shifts to the side where a current value is reduced with an offset corresponding to a current subtracted by the constant current source 32 from the curve A of the reference cell. For this reason, the curve C has an intermediate characteristic between the characteristics of the curves A and B, and the gradient of the characteristic curve has a tendency along those of the curves A and B. Accordingly, even in the case where the control gate voltage or the write level, etc. vary, the relative positional relationship between curves A and B and the curve C is unchanged. Thus, a stable readout operation is realized.

The curve D is a characteristic curve relating to the EPROM of the first embodiment. Also in the case of this curve D, in the same manner as in the curve C, the current drivability is reduced to such an extent that a dropped control gate voltage is delivered to the reference cell. The gradient of this curve D has a tendency along the tendencies of the gradients of the curves A and B. For this reason, in the same manner as in the curve C, the relative positional relationship between the curves A and B and the curve D is unchanged. Thus, a stable readout operation is realized.

As stated above, unlike the reference examples (curves E and F), EPROMs (curves D and C) of the first and second embodiments have a tendency similar to that of the memory cells (curves A and B), and take an intermediate value. For this reason and because of the fact that the reference cell is formed by the same process, a stable readout operation is realized.

Third embodiment

An EPROM of the third embodiment is a modified example of the EPROM of the second embodiment. This embodiment includes switch means for short-circuiting the input and output terminals of an invertor for an output.

Figure 6:
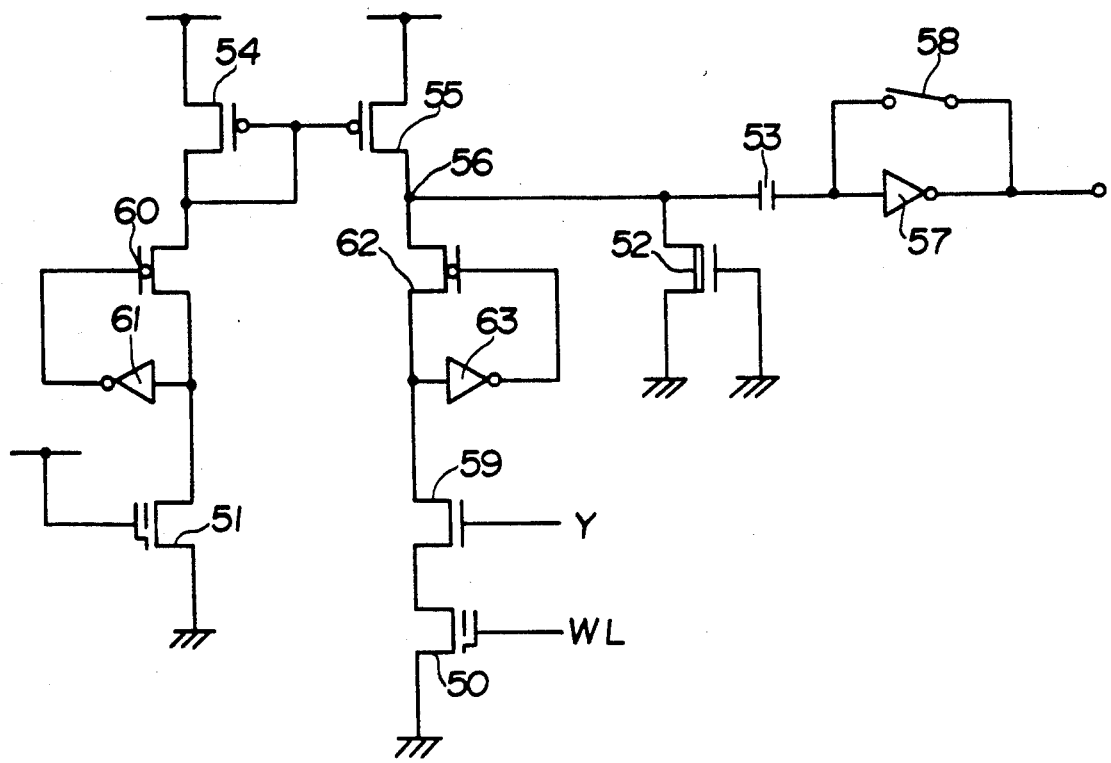
FIG. 6 is a circuit diagram showing the circuit configuration of a further embodiment of a ultraviolet-ray erasable nonvolatile memory device according to this invention.

Its circuit configuration includes, as shown in FIG. 6, a current mirror circuit comprised of a pair of a MOS transistors 54 and 55. A power supply voltage Vcc is delivered to each of sources of the pair of pMOS transistors 54 and 55. The gates of the pair of pMOS transistors 54 and 55 are connected commonly to the drain of the pMOS transistor 54.

The drain of the pMOS transistor 55 serves as a sensing node 56. By amplifying a potential on the sensing node 56, a readout operation is carried out. An invertor 57 is connected to the sensing node 56 through a capacitor 53. By this invertor 57, amplification of a voltage is carried out. Between the input terminal and the output terminal of the invertor 57, there is provided switch means 58 for short-circuiting these terminals. Before readout operation, switch means 58 is turned ON, so the input and output terminals of the invertor 57 are short-circuited. Thus, these input and output terminals are precharged so that the input and output levels become equal to ½ Vcc, respectively. At the time of a readout operation, the switch means 58 is turned OFF. By the operation of this switch means 58, it is possible to shorten a transition time in the case of reading out data inverted with respect to preceding data.

Further, in the EPROM of this embodiment, in the same manner as in the EPROM of the second embodiment, a depletion type MOS transistor 52 functioning as a constant current source is connected to the sensing node 56. A ground voltage GND is delivered to the node on the opposite side of the sensing node 56 of the MOS transistor 52. This depletion type MOS transistor 52 seemingly functions to lower the current drivability of the reference cell 51.

To the sensing node 56 and the drain of the pMOS transistor 54, nMOS transistors 62 and 60 each having a low threshold voltage functioning as a limiter are connected in the same manner as in the EPROM of the second embodiment, respectively. To the gates thereof, voltages obtained by inverting drain voltages are delivered by inverters 63 and 61, respectively.

Further, one of the source and the drain of the memory cell 50 is connected to the bit line through the column select transistor 59 in the same manner as in the second embodiment. A plurality of memory cells 50 are arranged in a matrix manner. Each memory cell has a structure comprising a floating gate and a control gate stacked through insulating films, respectively. The control gate thereof is connected to the word line WL for selection of rows. The memory cell 50 is such that information can be written thereinto by injecting electrons into the floating gate, and erased by ultraviolet rays.

The reference cell 51 connected to the drain of the nMOS transistor 60 is an element having a current drivability transmitted to the sensing node 56 by the current mirror circuit. This reference cell 51 includes a floating gate and a control gate formed by the same process as that of the memory cell 50. Accordingly, even in the case where there occurs unevenness in the process, the reference cell 51 and the memory cell 50 have the same tendency. The ground voltage GND is delivered to the source and the drain on the side opposite to the side connected to the nMOS transistor of the reference cell 51, and the power supply voltage Vcc is delivered to the control gate thereof.

The EPROM of this embodiment having such a circuit configuration is caused to have a high current drivability because the reference cell 51 undergoes erasing by ultraviolet rays in the same manner as in the memory cell. However, since a current in the pMOS transistor 55 of the current mirror circuit is subtracted by the depletion type MOS transistor 52 functioning as a constant current source, the current drivability of the reference cell 51 is allowed to be seemingly an intermediate value between the current drivability at the time of a write operation and that at the time of an erase operation (see the curve C in FIG. 5). Accordingly, in the same manner as in the second embodiment, a potential on the sensing node 56 rises at the time of a write operation and a potential on the sensing node 56 falls at the time of an erase operation. Thus, a reliable readout operation is carried out.

Further, especially in the case of the EPROM of this embodiment, since the invertor 57 for output includes switch means 58 for short-circuiting the input and output terminals before readout operation to precharge them, a stable readout operation and a high speed potential detection can be made.

What is claimed is:
1. A nonvolatile memory device comprising:
   a plurality of memory cells of a first conductivity type for storing data,
   a reference cell having the same structure and the same first conductivity type as said memory cells,
   a sense amplifier comprising a first MIS transistor of a second conductivity type, a second MIS transistor having the same structure and the same second conductivity type as said first MIS transistor, wherein said gate and drain electrodes of said first MIS transistor are connected to a first node and said gate electrode of said second MIS transistor is connected to said first node and said drain electrode of said second MIS transistor is connected to a second node, and said reference cell is connected between said first node and a ground node, and said memory cell is connected between said second node and ground note; and
   a constant current source connected between said second node and ground node,
   wherein the current drivability of said current source has an intermediate value between a value of the current drivability in an erased state and a value of the current drivability in a programmed state.
2. The ultraviolet erasable nonvolatile memory device according to claim 1,
   wherein the constant current source is a depletion type MOS transistor.
3. The ultraviolet erasable nonvolatile memory device according to claim 1,
   wherein an inverter connected to said node amplifies the potential of said node, and a input terminal and a output terminal of said inverter are connected each other by a switching means before data outputting operation. d
   * * * * *